United States Patent
Kuang

(10) Patent No.: US 9,431,913 B2
(45) Date of Patent: Aug. 30, 2016

(54) VOLTAGE DETECTING CIRCUIT FOR SWITCHING CONVERTERS AND THE METHOD THEREOF

(71) Applicant: Chengdu Monolithic Power Systems Co., Ltd., Chengdu (CN)

(72) Inventor: Naixing Kuang, Hangzhou (CN)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 43 days.

(21) Appl. No.: 14/097,207

(22) Filed: Dec. 4, 2013

(65) Prior Publication Data

US 2014/0152283 A1    Jun. 5, 2014

(30) Foreign Application Priority Data

Dec. 4, 2012    (CN) .......................... 2012 1 0512387

(51) Int. Cl.
*H02M 3/157*    (2006.01)
*H02M 3/335*    (2006.01)
*H02M 3/156*    (2006.01)
*G01R 19/00*    (2006.01)

(52) U.S. Cl.
CPC ......... *H02M 3/33523* (2013.01); *H02M 3/156* (2013.01); *G01R 19/0084* (2013.01)

(58) Field of Classification Search
CPC ........... H02M 3/33523; H02M 3/158; H02M 2001/0009; H05B 33/0815
USPC ......... 363/21.01, 21.04, 21.12, 21.16, 21.18, 363/48, 88, 89; 323/282–289; 315/219, 315/224, 226, 247, 276
See application file for complete search history.

(56) References Cited

U.S. PATENT DOCUMENTS

| | | | | |
|---|---|---|---|---|
| 5,901,051 | A * | 5/1999 | Takahashi | H02M 3/335 363/21.18 |
| 7,447,049 | B2 * | 11/2008 | Garner | H02M 3/33523 363/21.12 |
| 7,486,528 | B2 * | 2/2009 | Yang | H02M 3/33507 363/131 |
| 7,592,790 | B2 * | 9/2009 | Yang | H02M 1/36 323/277 |
| 7,859,324 | B2 * | 12/2010 | Yamashita | H02M 1/32 323/316 |
| 8,773,047 | B2 * | 7/2014 | Chen | 315/308 |
| 9,201,102 | B2 | 12/2015 | Wang et al. | |
| 2012/0153920 | A1 * | 6/2012 | Guenther et al. | 323/285 |
| 2013/0082742 | A1 | 4/2013 | Ren | |

* cited by examiner

*Primary Examiner* — Rajnikant Patel
(74) *Attorney, Agent, or Firm* — Perkins Coie LLP

(57) ABSTRACT

A voltage detecting circuit used with a switching converter. The switching converter having an energy storage component, a first power switch and a second switch. The voltage detecting circuit has a sample and hold circuit configured to sample and hold the voltage at the connection node of the energy storage component and the first power switch when the first power switch is OFF and the second power switch is ON; and an average circuit configured to average the sampled voltage during a switching period to generate a detecting signal in proportional to the output voltage of the switching converter.

12 Claims, 6 Drawing Sheets

VOLTAGE DETECTING CIRCUIT FOR SWITCHING CONVERTERS AND THE METHOD THEREOF

CROSS-REFERENCE TO RELATED APPLICATION(S)

This application claims priority to and the benefit of Chinese Patent Application No. 201210512387.X, filed Dec. 4, 2012, which is incorporated herein by reference in its entirety.

TECHNICAL FIELD

The present invention relates to electrical circuits, and more particularly but not exclusively to voltage detecting circuits applied in switching converters and the method thereof.

BACKGROUND

Switching converters are applied to convert an input power source to a desired power source so as to power electrical devices properly. In order to meet the input voltage requirement of the electrical devices, a voltage provided by the switching converter should be limited in a preset range. Thus, a voltage detecting circuit is needed to make sure the voltage provided by the switching converter is suitable. FIG. 1 schematically shows a prior art switching converter, i.e., Flyback converter with a voltage detecting circuit. As shown in FIG. 1, the voltage detecting circuit comprises an optocoupler D0, a third winding Lt, diodes D2 and D3, a capacitor C3, and resistors R10, R12, and R13. The optocoupler D0 detects an output voltage Vo of the Flyback converter, and the third winding Lt feeds back the output voltage Vo to a feedback pin FB of a control chip 101 of the Flyback converter. The voltage detecting circuit for detecting the output voltage Vo in FIG. 1 is very complicated, and many components like the optocoupler D0, the third winding Lt and so on are needed, which increases the cost.

SUMMARY

It is an object of the present invention to provide a voltage detecting circuit for switching converter and the method thereof.

In accomplishing the above the other objects, there has been provided, in accordance with an embodiment of the present invention, a voltage detecting circuit used with a switching converter, wherein the switching converter comprises an energy storage component, a first power switch and a second power switch coupled to the energy storage component, and the energy storage component stores energy when the first power switch is ON and provides energy to a load when the first power switch is OFF, the voltage detecting circuit comprising: a sample and hold circuit having an input terminal and an output terminal, wherein the input terminal is coupled to a connection node of the energy storage component and the first power switch, and wherein the sample and hold circuit samples the voltage at the connection node when the first power switch is OFF and the second power switch is ON, and provides a sampled signal at the output terminal; and an average circuit having an input terminal and an output terminal, wherein the input terminal is coupled to the output terminal of the sample and hold circuit to receive the sampled signal, and the average circuit performs an arithmetic operation on the sampled signal and provides a detecting signal based on the sampled signal at the output terminal, wherein the detecting signal is in proportional to the output voltage.

In addition, there has been provided, in accordance with an embodiment of the present invention, a switching converter, comprising: an energy storage component configured to receive an input voltage; a first power switch coupled to the energy storage component, wherein the energy storage component stores energy when the first power switch is ON and provides energy to a load when the first power switch is OFF; a second power switch coupled to the energy storage component; a sample and hold circuit having an input terminal and an output terminal, wherein the input terminal is coupled to a connection node of the energy storage component and the first power switch, and wherein the sample and hold circuit samples the voltage at the connection node when the first power switch is OFF and the second power switch is ON, and provides a sampled signal at the output terminal; and an average circuit having an input terminal and an output terminal, wherein the input terminal is coupled to the output terminal of the sample and hold circuit to receive the sampled signal, and the average circuit performs arithmetic operation on the sampled signal and provides a detecting signal based on the sampled signal at the output terminal, wherein the detecting signal is in proportional to the output voltage.

Furthermore, there has been provided, in accordance with an embodiment of the present invention, a voltage detecting method for switching converter, wherein the switching converter comprises an energy storage component, a first power switch and a second power switch coupled to the energy storage component, and the energy storage component stores energy when the first power switch is ON and provides energy to a load when the first power switch is OFF, the voltage detecting circuit comprising: sampling and holding a voltage at the connection node of the first power switch and the energy storage component when the first power switch is OFF and the second power switch is ON; and performing arithmetic operation on the sampled voltage to generate a detecting voltage.

The presented voltage detecting circuit and the method thereof detects the output voltage of the switching converter without any discrete components. The voltage detecting circuit could be completely integrated in a control circuit of the switching converter, so as to simplify the configuration of the switching converter and meanwhile save the cost.

DETAILED DESCRIPTION

Embodiments of voltage detecting circuit for switching converters are described in detail herein. In the following description, some specific details, such as example circuits for these circuit components, are included to provide a thorough understanding of embodiments of the invention. One skilled in relevant art will recognize, however, that the invention can be practiced without one or more specific details, or with other methods, components, materials, etc.

The following embodiments and aspects are illustrated in conjunction with circuits and methods that are meant to be exemplary and illustrative. In various embodiments, the above problem has been reduced or eliminated, while other embodiments are directed to other improvements.

Figure 1:
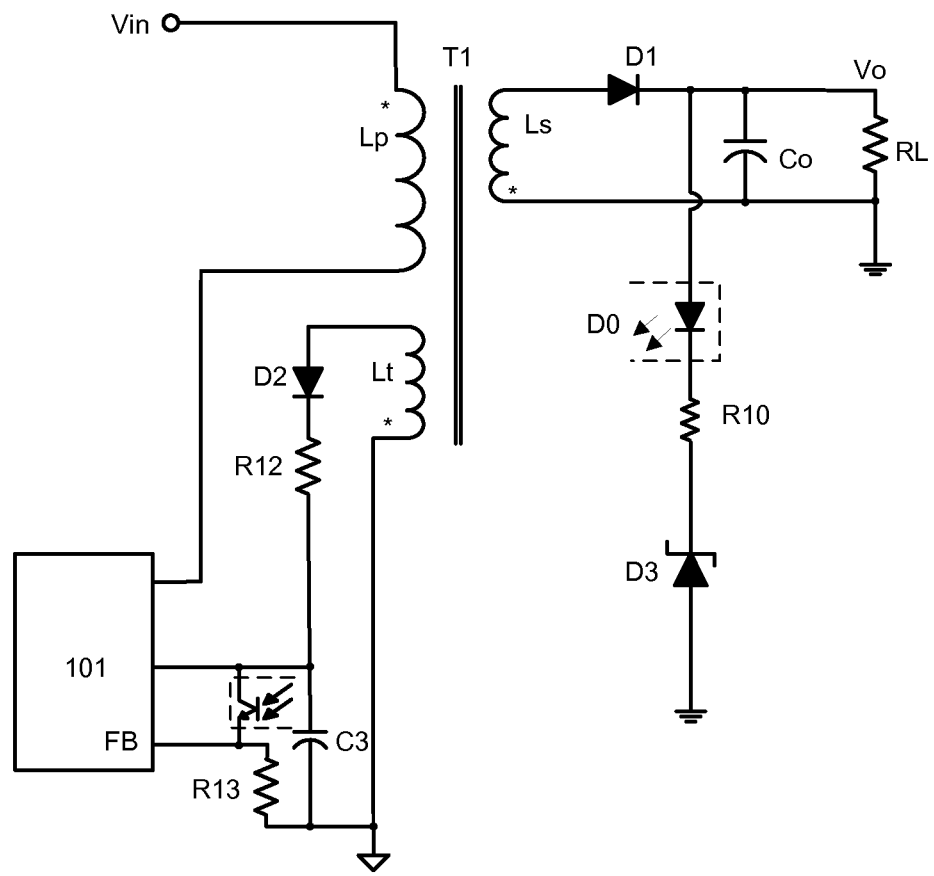
FIG. 1 schematically shows a prior art switching converter, i.e., Flyback converter with a voltage detecting circuit.
Figure 2:
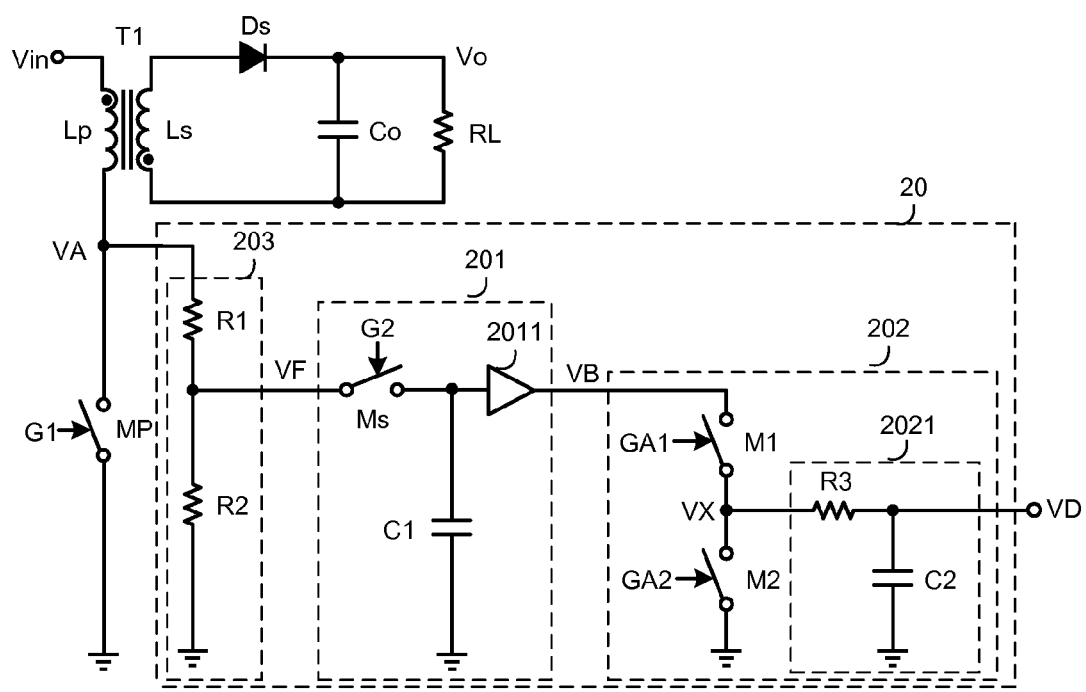
FIG. 2 schematically shows a voltage detecting circuit 20 in accordance with an embodiment of the present invention.

FIG. 2 schematically shows a voltage detecting circuit 20 in accordance with an embodiment of the present invention. In the example of FIG. 2, the voltage detecting circuit 20 is applied in a Flyback converter. The Flyback converter comprises an energy storage component T1, a first power switch MP coupled in series to the energy storage component T1, a second power switch Ds, and an output capacitor Co. A voltage across the output capacitor Co is an output voltage Vo of the Flyback converter provided to a load RL. The energy storage component T1 comprises a transformer having a primary winding Lp and a secondary winding Ls with a turns ratio Np:Ns. The primary winding Lp is configured to receive an input voltage Vin. The second power switch Ds comprises a diode. The energy is stored in the primary winding Lp when the first power switch MP is ON, and is transferred to the secondary winding Ls so as to charge the output capacitor Co and meanwhile to power the load RL when the first power switch MP is OFF. The first power switch MP is controlled by a switching control signal G1 which may be provided by any known control circuit for Flyback converters.

In the example of FIG. 2, the voltage detecting circuit 20 comprises: a voltage divider circuit 203 having an input terminal coupled to a connection node of the energy storage component T1 and the first power switch MP to receive a node voltage VA, and an output terminal configured to provide a divided voltage signal VF in proportional to the node voltage VA; a sample and hold circuit 201 having an input terminal and an output terminal, wherein the input terminal is coupled to the output terminal of the voltage divider circuit 203 to receive the divided voltage signal VF, and wherein the sample and hold circuit 201 samples the divided voltage signal VF when the first power switch MP is OFF and the second power switch Ds is ON, and provides a sampled signal VB at the output terminal; and an average circuit 202 having an input terminal and an output terminal, wherein the input terminal is coupled to the output terminal of the sample and hold circuit 201 to receive the sampled signal VB, and wherein the average circuit 202 performs arithmetic operation on the sampled signal VB and provides a detecting signal VD based on the sampled signal at the output terminal, wherein the detecting signal is in proportional to the output voltage Vo.

In one embodiment, the voltage divider circuit 203 comprises a first resistor R1 and a second resistor R2. The voltage divider circuit 203 is known to persons of ordinary skill in the art, and is not described here for brevity. Persons of ordinary skill in the art should know that any circuit that may get a divided voltage signal in proportional to the node voltage VA may be used without detracting from the merits of the present invention. Furthermore, if the node voltage VA is within the input range of the sample and hold circuit 201, the voltage divider circuit 203 may be omitted, and the input terminal of the sample and hold circuit 201 is coupled to the connection node of the energy storage component T1 and the first power switch MP to receive the node voltage VA.

In one embodiment, the sample and hold circuit 201 comprises: a sample switch Ms having a first terminal, a second terminal and a control terminal, wherein the first terminal is coupled to the output terminal of the voltage divider circuit 203 to receive the divided voltage signal VF, the control terminal is configured to receive a sample control signal G2, and wherein the sample switch Ms is turned ON by the sample control signal G2 during when the first power switch MP is OFF and the second power switch Ds is ON; and a sample capacitor C1 having a first terminal coupled to the second terminal of the sample switch Ms, and a second terminal coupled to a ground reference.

In one embodiment, the sample and hold circuit 201 further comprises a driver 2011 coupled between the first terminal of the sample capacitor C1 and the output terminal of the sample and hold circuit 201. Persons of ordinary skill in the art should know that the configuration of the driver 2011 is to prevent charge leakage from the sample capacitor C1 to the output terminal of the sample and hold circuit 201.

In one embodiment, the waveform of the sample control signal G2 indicates the state of the second power switch Ds. When the second power switch Ds is ON, the sample control signal G2 has a first state, for example, logical high state; when the second power switch Ds is OFF, the sample control signal G2 has a second state, for example, logical low state.

In one embodiment, the sample switch Ms is ON when the sample control signal G2 is logical high, and is OFF when the sample control signal G2 is logical low.

In one embodiment, the sample control signal G2 may be generated by comparing the node voltage VA at the connection node of the energy storage component T1 and the first power switch MP with a reference voltage. When the first power switch MP is ON, the node voltage VA is almost zero; when the first power switch MP is OFF, and the second power switch Ds is ON, $$VA = Vin + \frac{Np}{Ns} \times Vo;$$

and when the first power switch MP and the second power switch Ds are both OFF, the node voltage VA is damping. So the value of the node voltage VA reaches its maximum value Vin+Vo×Np/Ns when the second power switch Ds is ON. Thus, the comparison of the node voltage VA with a reference voltage having a value of Vin+Vo×Np/Ns may get the sample control signal G2. For example, the sample control signal G2 may have the first state when the node voltage VA reaches Vin+Vo×Np/Ns and have the second state when the node voltage VA is lower than Vin+Vo×Np/Ns In real application, because during when the first power switch MP is ON or during when the first power switch MP and the second power switch Ds are both OFF, the node voltage VA is lower than Vin+Vo×Np/Ns the node voltage VA may be compared with a reference voltage having a value between zero and Vin+Vo×Np/Ns. The reference voltage may be chosen according to the real application and the accuracy requirement of the system.

In one embodiment, the sample control signal G2 may be generated by detecting the ON and OFF of the first power switch MP and zero crossing of a current Is flowing through the secondary winding Ls. For example, the sample control signal G2 may switch from the first state to the second state at the moment the first power switch MP is turned OFF, and may switch from the second state to the first state when the current Is crosses zero.

The sample and hold circuit 201 samples the node voltage VA at the connection node of the energy storage component T1 and the first power switch MP when the second power switch Ds is ON, and then holds the sampled voltage value during the rest time until the first power switch MP is OFF and the second switch Ds is ON again. Any circuit that could accomplish the above function may be used without detracting from the merits of the present invention.

In one embodiment, the average circuit 202 comprises: a first switch M1 having a first terminal, a second terminal and a control terminal, wherein the first terminal is coupled to the output terminal of the sample and hold circuit 201, and the control terminal is configured to receive a first control signal GA1, and wherein the first switch M1 is turned ON by the first control signal GA1 when the first power switch MP is ON, and is turned OFF by the first control signal GA1 when the first power switch MP is OFF; a second switch M2 having a first terminal, a second terminal and a control terminal, wherein the first terminal is coupled to the second terminal of the first switch M1, the second terminal is coupled to the reference ground, and the control terminal is configured to receive a second control signal GA2, and wherein the second switch M2 is turned ON by the second control signal GA2 when the second power switch Ds is ON, and is turned OFF by the second control signal GA2 when the second power switch Ds is OFF; a low pass filter circuit 2021 having an input terminal coupled to the connection node of the first switch M1 and the second switch M2, and an output terminal configured to provide a detecting signal VD indicating the output voltage Vo of the Flyback converter.

In one embodiment, the low pass filter circuit 2021 comprises: a third resistor R3 having a first terminal coupled to the connection node of the first switch M1 and the second switch M2, and a second terminal coupled to the output terminal of the average circuit 202; and an average capacitor C2 having a first terminal coupled to the second terminal of the third resistor R3 and a second terminal coupled to the ground reference.

In one embodiment, the first control signal GA1 has the same phase with the switching control signal G1 of the first power switch MP; and the second control signal GA2 has the same phase with the sample control signal G2.

Figure 3:
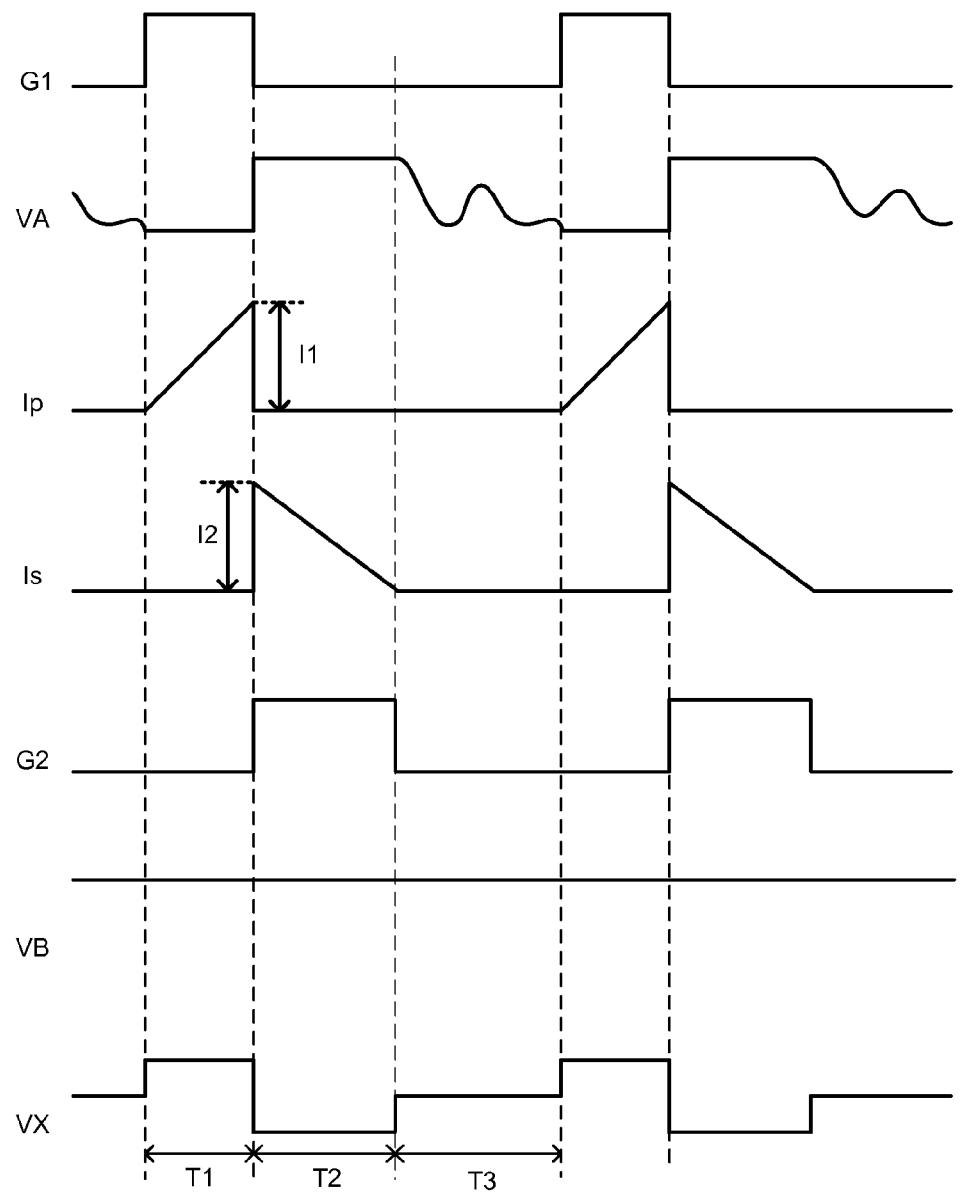
FIG. 3 shows the waveforms of signals of the Flyback converter in FIG. 2 during when the Flyback converter is working under discontinuous current mode.

FIG. 3 shows the waveforms of signals of the Flyback converter in FIG. 2 during when the Flyback converter is working under discontinuous current mode, wherein Ip represents a current flowing through the primary winding Lp and Is represents a current flowing through the secondary winding Ls. The operation of the voltage detecting circuit 20 in Flyback converter is described below with reference to FIGS. 2 and 3.

During subinterval T1, the switching control signal G1 is logical high and the first power switch MP is ON. During this time, the node voltage VA is almost zero, and the current Ip flowing through the primary winding Lp increases. As described before, the sample control signal G2 is logical low now, and the sample switch Ms is OFF. As a result, the sampled signal VB generated by the sample and hold circuit 201 maintains. Because the first control signal GA1 has the same phase with the switching control signal G1, and the second control signal GA2 has the same phase with the sample control signal G2, the first switch M1 is ON and the second switch M2 is OFF. Thus the voltage VX at the connection node of the first switch M1 and the second switch M2 is equal to the sampled signal VB as shown in FIG. 3.

During subinterval T2, the switching control signal G1 is logical low and the first power switch MP is OFF. The node voltage VA is equal to Vin+Vo×Np/Ns. Meanwhile, the current Ip flowing through the primary winding Lp is zero, and the current Is flowing through the secondary winding Ls decreases. During this time, the sample control signal G2 is logical high, and the sample switch Ms is ON. That means the sampled signal VB is equal to the divided voltage signal VF, and could be expressed as:

$$VB = VF = \frac{R2}{R1+R2} \times VA = K \times \left(Vin + \frac{Np}{Ns} \times Vo\right) \quad (1)$$

wherein K is the proportion of the divided voltage signal VF to the node voltage VA, i.e., $$K = \frac{R2}{R1+R2}.$$

The second switch M2 is ON when the first switch M1 is OFF, so the voltage VX at the connection node of the first switch M1 and the second switch M2 is equal to zero now.

The Flyback converter is working under discontinuous current mode. Thus during subinterval T3, the switching control signal G1 is still logical low, and the first power switch MP is OFF. The current Is flowing through the secondary winding is zero. During this time, the sample switch Ms is OFF and voltage across the sample capacitor C1 maintains, i.e., the sampled signal VB maintains. Because the first switch M1 and the second switch M2 are both OFF during subinterval T3, the voltage VX at the connection node of the first switch M1 and the second switch M2 is equal to the detecting signal VD.

The low pass filter circuit 2021 filters the voltage VX to generate the detecting signal VD. So the detecting signal VD is the average value of the voltage VX during a switching period of the Flyback converter, and could be expressed as:

$$VD = \frac{K \times \left(Vin + \frac{Np}{Ns} \times Vo\right) \times T1}{T1+T2} \quad (2)$$

Persons of ordinary skill in the art should know that the current Ip, Is and the primary winding Lp, the secondary winding Ls have the following relationship when the switching converter works under steady state:

$$Ip = \frac{Vin \times T1}{Lp} \quad (3)$$

$$Is = \frac{Vo \times T2}{Ls} \quad (4)$$

$$Ip:Is = Ns:Np \quad (5)$$

$$Lp:Ls = (Np:Ns)^2 \quad (6)$$

Substitution of EQs. (4), (5) and (6) into EQ. (3) and solution for the input voltage Vin yields:

$$Vin = Vo \times \frac{T2}{T1} \times \frac{Np}{Ns} \quad (7)$$

And substitution of EQ. (7) into EQ. (2) and solution for the detecting signal VD yields:

$$VD = K \times \frac{Np}{Ns} \times Vo \quad (8)$$

As can be seen from EQ. (8), the detecting signal VD is in proportional to the output voltage Vo. Thus, the voltage detecting circuit 20 may perform the function of detecting the output voltage Vo.

Figure 4:
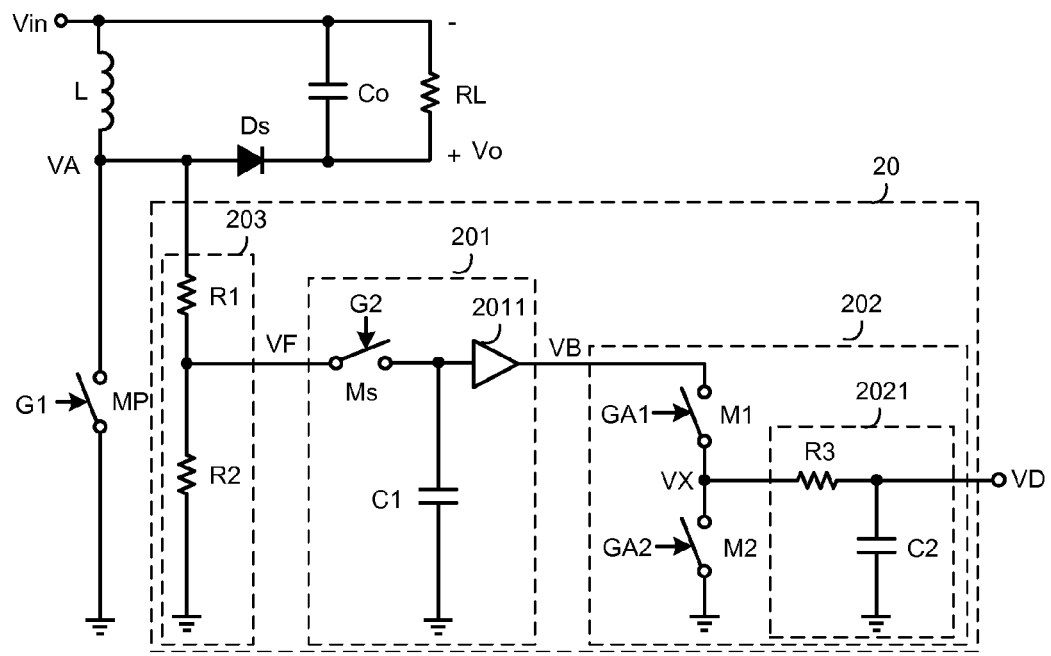
FIG. 4 schematically shows a voltage detecting circuit 20 applied in a step-up/step-down converter in accordance with an embodiment of the present invention.

FIG. 4 schematically shows a voltage detecting circuit 20 applied in a step-up/step-down converter in accordance with an embodiment of the present invention. In the example of FIG. 4, the step-up/step-down converter comprises an energy storage component L, a first power switch MP and a second power switch Ds coupled to the energy storage component L, and an output capacitor Co. The output voltage Vo is provided across the output capacitor Co, and is provided to power the load RL. In one embodiment, the energy storage component L comprises an inductor. When the first power switch MP is ON, the energy storage component L stores energy, and the output capacitor Co provides energy to the load RL; when the first power switch MP is OFF, the second power switch Ds is conducted to maintain a current flowing through the energy storage component L, and meanwhile the energy stored in the energy storage component L is supplied to the load RL. The switching control signal G1 of the first power switch MP may be provided by any known control circuit for Buck-Boost converter.

In FIG. 4, the input terminal of the voltage divider circuit 203 is coupled to the connection node of the energy storage component L and the first power switch MP, the output terminal of the voltage divider circuit 203 provides the divided voltage signal VF in proportional to the node voltage VA at the connection node of the energy storage component L and the first power switch MP. The input terminal of the sample and hold circuit 201 is coupled to the output terminal of the voltage divider circuit 203. When the first power switch MP is OFF and the second switch Ds is ON, the sample and hold circuit 201 samples the divided voltage signal VF, and generates the sampled signal VB at the output terminal based thereupon, wherein the value of the sampled signal VB maintains during the rest time until the first power switch MP is OFF and the second power switch Ds is ON again. The input terminal of the average circuit 202 is coupled to the output terminal of the sample and hold circuit 201 to receive the sampled signal VB, and the output terminal of the average circuit 202 provides the detecting signal VD in proportional to the output voltage Vo of the step-up/step-down converter.

In one embodiment, the waveform of the sample control signal G2 indicates the state of the second power switch Ds. When the second power switch Ds is OFF, the sample control signal G2 has a first state, for example, logical high state; when the second power switch Ds is ON, the sample control signal G2 has a second state, for example, logical low state.

In one embodiment, the sample switch Ms is ON when the sample control signal G2 is logical high, and is OFF when the sample control signal G2 is logical low.

In one embodiment, the sample control signal G2 may be generated by comparing the node voltage VA of the connection node of the energy storage component L and the first power switch MP to a reference voltage. When the first power switch MP is ON, the node voltage VA is almost zero; when the first power switch MP is OFF, and the second power switch Ds is ON, VA=Vin+Vo; when the first power switch MP and the second power switch Ds are both OFF, the node voltage VA is damping. So the value of the node voltage VA reaches its maximum value Vin+Vo when the second power switch Ds is ON. Thus, the comparison of the node voltage VA with a reference voltage having a value of Vin+Vo may get the sample control signal G2. For example, the sample control signal may have the first state when the node voltage VA reaches Vin+Vo and have the second state when the node voltage VA is lower than Vin+Vo. In real application, during when the first power switch MP is ON and during when the first power switch MP and the second power switch Ds are both OFF, the node voltage VA is lower than Vin+Vo, so the node voltage VA may be compare with a reference voltage having a value between zero and Vin+Vo. The reference voltage may be chosen according to the application and the accuracy requirement of the system.

In one embodiment, the sample control signal G2 may be generated by detecting the ON and OFF of the first power switch MP and zero crossing of a current IL flowing through the energy storage component L. For example, the sample control signal G2 may switch from the first state to the second state at the moment the first power switch MP is turned OFF, and may switch from the second state to the first state when the current IL crosses zero.

Figure 5:
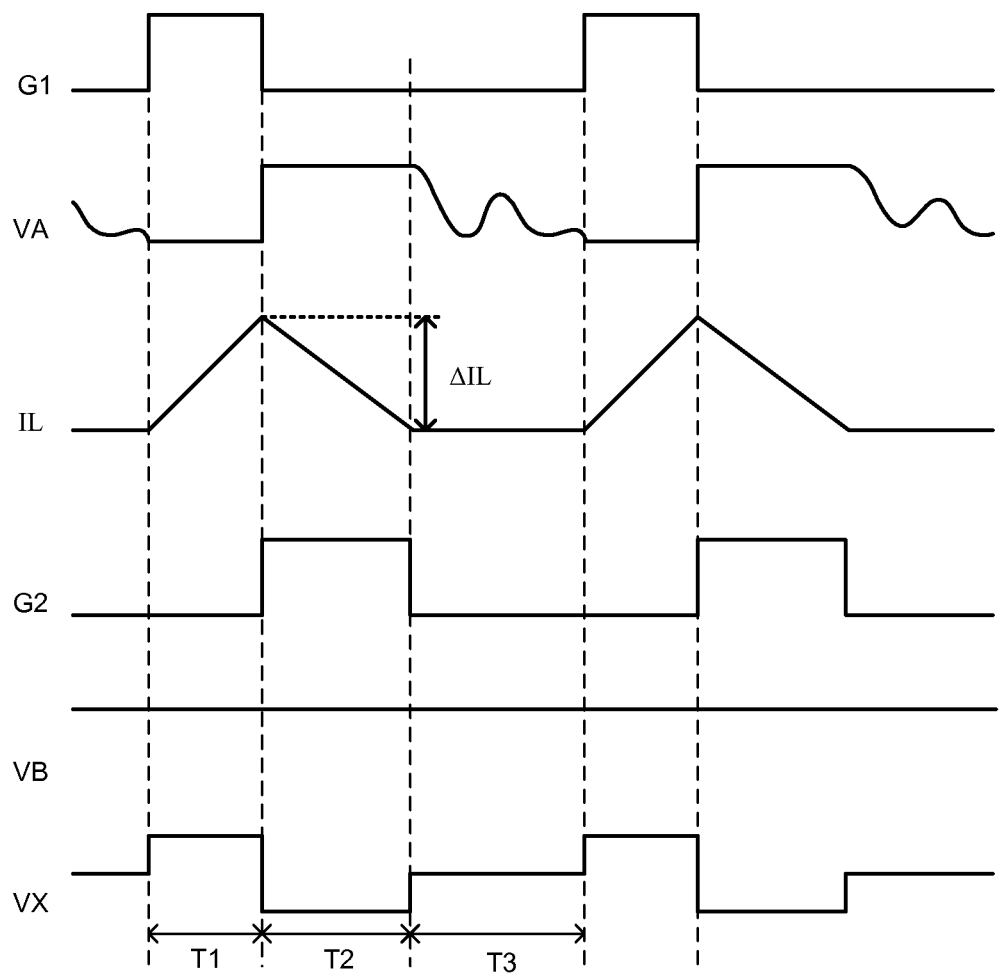
FIG. 5 shows the waveforms of signals of the step-up/step-down converter in FIG. 4 during when the step-up/step-down converter is working under discontinuous current mode.

FIG. 5 shows the waveforms of signals of the Buck-Boost converter in FIG. 4 during when the step-up/step-down converter is working under discontinuous current mode. The operation of the voltage detecting circuit 20 in the step-up/step-down converter is described below with reference to FIGS. 4 and 5.

During subinterval T1, the switching control signal G1 is logical high and the first power switch MP is ON. During this time, the node voltage VA is almost zero, and the current IL flowing through the energy storage component L increases. As described before, the sample control signal G2 is logical low now, and the sample switch Ms is OFF. As a result, the sampled signal VB generated by the sample and hold circuit 201 maintains. Because the first control signal GA1 has the same phase with the switching control signal G1, and the second control signal GA2 has the same phase with the sample control signal G2, the first switch M1 is ON and the second switch M2 is OFF. Thus the voltage VX at the connection node of the first switch M1 and the second switch M2 is equal to the sampled signal VB as shown in FIG. 5.

During subinterval T2, the switching control signal G1 is logical low and the first power switch MP is OFF. The node voltage VA is equal to Vin+Vo. Meanwhile, the current IL flowing through the energy storage component L decreases. During this time, the sample control signal G2 is logical high, and the sample switch Ms is ON. That means the sampled signal VB is equal to the divided voltage signal VF, and could be expressed as:

$$VB = VF = \frac{R2}{R1 + R2} \times VA = K \times (Vin + Vo) \quad (9)$$

wherein K is the proportion of the divided voltage signal VF to the node voltage VA, i.e., $$K = \frac{R2}{R1 + R2}.$$

The second switch M2 is ON when the first switch M1 is OFF, so the voltage VX at the connection node of the first switch M1 and the second switch M2 is equal to zero now.

The step-up/step-down converter is working under discontinuous current mode. Thus during subinterval T3, the switching control signal G1 is logical low, and the first power switch MP is OFF. The current IL flowing through the energy storage component L is zero. During this time, the sample switch Ms is OFF and voltage across the sample capacitor C1 maintains, i.e., the sampled signal VB maintains. Because the first switch M1 and the second switch M2 are both OFF during subinterval T3, the voltage VX at the connection node of the first switch M1 and the second switch M2 is equal to the detecting signal VD.

The low pass filter circuit 2021 filters the voltage VX to generate the detecting signal VD. So the detecting signal VD is the average value of the voltage VX during a switching period of the Buck-Boost converter, and could be expressed as:

$$VD = \frac{K \times (Vin + Vo) \times T1}{T1 + T2} \quad (10)$$

Persons of ordinary skill in the art should know that when the step-up/step-down converter works under steady state, the increment and the decrement of the current IL in a switching period are both ΔIL as shown in FIG. 5, thus:

$$Vin \times T1 = Vo \times T2 \quad (11)$$

substitution of EQ. (11) into EQ. (10) and solution for Vin yields:

$$VD = K \times Vo \quad (12)$$

As can be seen from EQ. (12), the detecting signal VD is proportional to the output voltage Vo. Thus, the voltage detecting circuit 20 may perform the function of detecting the output voltage Vo.

Although the voltage detecting circuit 20 applied in several switching converters working under discontinuous current mode are presented before, persons of ordinary skill in the art should know that the voltage detecting circuit 20 is also suitable for switching converters working under boundary current mode and continuous current mode after reading the present invention. Meanwhile, the voltage detecting circuit 20 is also suitable for switching converters like Buck converter, Boost converter, Forward converter and so on.

Figure 6:
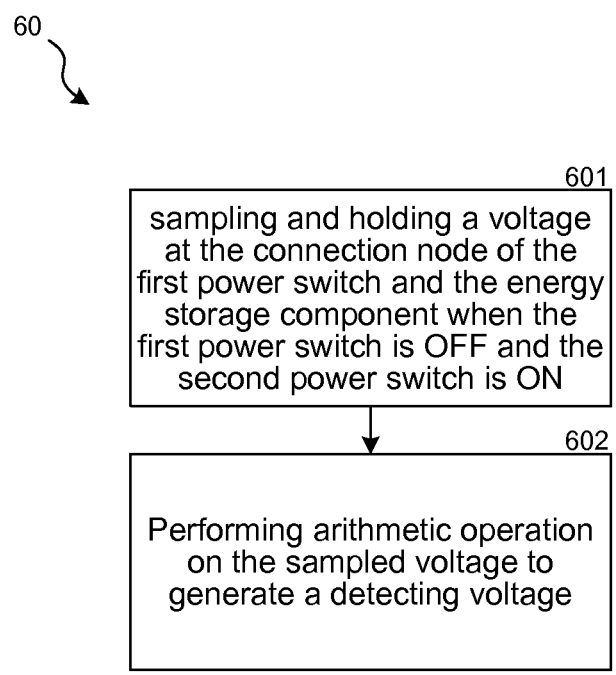
FIG. 6 shows a voltage detecting method 60 for switching converters in accordance with an embodiment of the present invention.

FIG. 6 shows a voltage detecting method 60 for switching converters in accordance with an embodiment of the present invention. The switching converter may have a first power switch, a second power switch and an energy storage component, wherein the energy storage component stores energy when the first power switch is ON, and provides energy to a load when the first power switch is OFF. The voltage detecting method comprises: step 601, sampling and holding a voltage at the connection node of the first power switch and the energy storage component when the first power switch is OFF and the second power switch is ON; step 602, performing arithmetic operation on the sampled voltage to generate a detecting voltage.

In one embodiment, the step 602 comprises: providing the sampled voltage to an input terminal of a low pass filter circuit; coupling the input terminal of the low pass filter circuit to a ground reference when the first power switch is OFF and the second power switch is ON; and generating the detecting voltage at an output terminal of the low pass filter circuit.

It is to be understood in these letters patent that the meaning of "A" is coupled to "B" is that either A and B are connected to each other as described below, or that, although A and B may not be connected to each other as described above, there is nevertheless a device or circuit that is connected to both A and B. This device or circuit may include active or passive circuit elements, where the passive circuit elements may be distributed or lumped-parameter in nature. For example, A may be connected to a circuit element that in turn is connected to B.

This written description uses examples to disclose the invention, including the best mode, and also to enable a person skilled in the art to make and use the invention. The patentable scope of the invention may include other examples that occur to those skilled in the art.

I claim:

1. A voltage detecting circuit used with a switching converter, wherein the switching converter comprises an energy storage component, a first power switch and a second power switch coupled to the energy storage component, and the energy storage component stores energy when the first power switch is ON and provides energy to a load when the first power switch is OFF, the voltage detecting circuit comprising:
   a sample and hold circuit having an input terminal and an output terminal, wherein the input terminal is coupled to a connection node of the energy storage component and the first power switch, and wherein the sample and hold circuit samples the voltage at the connection node when the first power switch is OFF and the second power switch is ON, and provides a sampled signal at the output terminal; and
   an average circuit having an input terminal and an output terminal, wherein the input terminal is coupled to the output terminal of the sample and hold circuit to receive the sampled signal, and the average circuit performs an arithmetic operation on the sampled signal and provides a detecting signal based on the sampled signal at the output terminal, wherein the detecting signal is in proportional to the output voltage;
   wherein the average circuit comprises:
   a first switch having a first terminal, a second terminal and a control terminal, wherein the first terminal is coupled to the output terminal of the sample and hold circuit, and the control terminal is configured to receive a first control signal, and wherein the first switch is turned ON by the first control signal when the first power switch is ON, and is turned OFF by the first control signal when the first power switch is OFF;

a second switch having a first terminal, a second terminal and a control terminal, wherein the first terminal is coupled to the second terminal of the first switch, the second terminal is coupled to a reference ground, and the control terminal is configured to receive a second control signal, and wherein the second switch is turned ON by the second control signal when the second power switch is ON, and is turned OFF by the second control signal when the second power switch is OFF; and a low pass filter circuit having an input terminal coupled to the connection node of the first switch and the second switch, and an output terminal configured to provide a detecting signal indicating the output voltage of the switching converter.

2. The voltage detecting circuit of claim 1, wherein the sample and hold circuit comprises:

a sample switch having a first terminal, a second terminal and a control terminal, wherein the first terminal is coupled to the connection node of the energy storage component and the first power switch, the control terminal is configured to receive a sample control signal, and wherein the sample switch is turned ON by the sample control signal during when the first power switch is OFF and the second power switch is ON; and a sample capacitor having a first terminal coupled to the second terminal of the sample switch, and a second terminal coupled to a ground reference.

3. The voltage detecting circuit of claim 2, wherein the sample and hold circuit further comprises a driver coupled between the first terminal of the sample capacitor and the output terminal of the sample and hold circuit.

4. The voltage detecting circuit of claim 1, further comprising a voltage divider circuit having an input terminal coupled to a connection node of the energy storage component and the first power switch to receive the node voltage at the connection node, and an output terminal configured to provide a divided voltage signal to the sample and hold circuit, wherein the divided voltage signal is in proportional to the node voltage at the connection node of the energy storage component and the first power switch, and wherein the input terminal of the sample and hold circuit is configured to receive the divided voltage signal instead of receiving the node voltage at the connection node of the energy storage component and the first power switch.

5. The voltage detecting circuit of claim 4, wherein the sample and hold circuit comprises:

a sample switch having a first terminal, a second terminal and a control terminal, wherein the first terminal is coupled to the output terminal of the voltage divider circuit, the control terminal is configured to receive a sample control signal, and wherein the sample switch is turned ON by the sample control signal during when the first power switch is OFF and the second power switch is ON; and a sample capacitor having a first terminal coupled to the second terminal of the sample switch, and a second terminal coupled to the ground reference.

6. The voltage detecting circuit of claim 5, wherein the sample and hold circuit further comprises a driver coupled between the first terminal of the sample capacitor and the output terminal of the sample and hold circuit.

7. The voltage detecting circuit of claim 1, wherein the low pass filter circuit comprise:

a resistor having a first terminal coupled to the connection node of the first switch and the second switch, and a second terminal coupled to the output terminal of the average circuit; and an average capacitor having a first terminal coupled to the second terminal of the resistor and a second terminal coupled to the ground reference.

8. A switching converter comprising:

an energy storage component configured to receive an input voltage;

a first power switch coupled to the energy storage component, wherein the energy storage component stores energy when the first power switch is ON and provides energy to a load when the first power switch is OFF;

a second power switch coupled to the energy storage component;

a sample and hold circuit having an input terminal and an output terminal, wherein the input terminal is coupled to a connection node of the energy storage component and the first power switch, and wherein the sample and hold circuit samples the voltage at the connection node when the first power switch is OFF and the second power switch is ON, and provides a sampled signal at the output terminal; and an average circuit having an input terminal and an output terminal, wherein the input terminal is coupled to the output terminal of the sample and hold circuit to receive the sampled signal, and the average circuit performs arithmetic operation on the sampled signal and provides a detecting signal based on the sampled signal at the output terminal, wherein the detecting signal is in proportional to the output voltage;

wherein the average circuit comprises:

a first switch having a first terminal, a second terminal and a control terminal, wherein the first terminal is coupled to the output terminal of the sample and hold circuit, and the control terminal is configured to receive a first control signal, and wherein the first switch is turned ON by the first control signal when the first power switch is ON, and is turned OFF by the first control signal when the first power switch is OFF;

a second switch having a first terminal, a second terminal and a control terminal, wherein the first terminal is coupled to the second terminal of the first switch, the second terminal is coupled to a reference ground, and the control terminal is configured to receive a second control signal, and wherein the second switch is turned ON by the second control signal when the second power switch is ON, and is turned OFF by the second control signal when the second power switch is OFF; and a low pass filter circuit having an input terminal coupled to the connection node of the first switch and the second switch, and an output terminal configured to provide a detecting signal indicating the output voltage of the switching converter.

9. The switching converter of claim 8, wherein the sample and hold circuit comprises:

a sample switch having a first terminal, a second terminal and a control terminal, wherein the first terminal is coupled to the connection node of the energy storage component and the first power switch, the control terminal is configured to receive a sample control signal, and wherein the sample switch is turned ON by the sample control signal during when the first power switch is OFF and the second power switch is ON; and a sample capacitor having a first terminal coupled to the second terminal of the sample switch, and a second terminal coupled to the ground reference.

10. The switching converter of claim 9, wherein the sample and hold circuit further comprises a driver coupled between the first terminal of the sample capacitor and the output terminal of the sample and hold circuit.

11. The switching converter of claim 1, wherein the low pass filter circuit comprises:
   a third resistor having a first terminal coupled to the connection node of the first switch and the second switch, and a second terminal coupled to the output terminal of the average circuit; and
   an average capacitor having a first terminal coupled to the second terminal of the third resistor and a second terminal coupled to the ground reference.

12. A voltage detecting method for switching converter, wherein the switching converter has a first power switch, a second power switch and an energy storage component, and wherein the energy storage component stores energy when the first power switch is ON, and provides energy to a load when the first power switch is OFF, the voltage detecting method comprising:
   sampling and holding a voltage at the connection node of the first power switch and the energy storage component when the first power switch is OFF and the second power switch is ON; and
   performing arithmetic operation on the sampled voltage to generate a detecting voltage;
   wherein performing arithmetic operation on the sampled voltage to generate a detecting voltage comprises:
   providing the sampled voltage to an input terminal of a low pass filter circuit;
   coupling the input terminal of the low pass filter circuit to a ground reference when the first power switch is OFF and the second power switch is ON; and
   generating the detecting voltage at an output terminal of the low pass filter circuit.

\* \* \* \* \*